(12) United States Patent
Burns et al.

(10) Patent No.: US 7,068,104 B2
(45) Date of Patent: Jun. 27, 2006

(54) POWER AMPLIFIER UTILIZING HIGH BREAKDOWN VOLTAGE CIRCUIT TOPOLOGY

(75) Inventors: Lawrence M. Burns, Los Altos, CA (US); Chong L. Woo, Fremont, CA (US); Clement Szeto, Union City, CA (US)

(73) Assignee: Amalfi Semiconductor, Inc., Los Gatos, CA (US)

( * ) Notice: Subject to any disclaimer, the term of this patent is extended or adjusted under 35 U.S.C. 154(b) by 0 days.

(21) Appl. No.: 10/888,478

(22) Filed: Jul. 8, 2004

(65) Prior Publication Data

US 2006/0006950 A1    Jan. 12, 2006

(51) Int. Cl.
*H03F 3/45* (2006.01)
(52) U.S. Cl. ............................ 330/253; 330/311
(58) Field of Classification Search ............ 330/253, 330/252, 311, 260, 165; 333/213, 214, 215, 333/216, 217
See application file for complete search history.

(56) References Cited

U.S. PATENT DOCUMENTS

| | | | |
|---|---|---|---|
| 5,196,737 A * | 3/1993 | Olmstead | 327/208 |
| 5,587,689 A * | 12/1996 | Bowers | 330/254 |
| 5,726,600 A * | 3/1998 | Raghavan et al. | 327/553 |
| 6,737,948 B1 | 5/2004 | Aoki et al. | 336/200 |

OTHER PUBLICATIONS

Aoki, Ichiro, et al., "Fully Integrated CMOS Power Amplifier Design Using the Distributed Active-Transformer Architecture," *IEEE Journal of Solid-State Circuits*, 0018-9200/02, vol. 37, No. 3, Mar. 2002, pp. 371-383.
Aoki, Ichiro, et al., "Distributed Active Transformer—A New Power-Combining and Impedance-Transformation Technique," *IEEE Transactions on Microwave Theory and Techniques*, 0018-9480/02, vol. 50, No. 1, Jan. 2002, pp. 316-331.
Aoki, Ichiro, et al., "A 2.4-GHz, 2.2-W, 2-V Fully-Integrated CMOS Circular-Geometry Active-Transformer Power Amplifier," *IEEE 2001 Custom Integrated Circuits Conference*, 0-7803-6591-7/01, 2001, pp. 57-60.
Bohn, Florian, et al., "Demonstration of a Switchless Class $E/F_{odd}$ Dual-Band Power Amplifier," *IEEE MTT-S Digest*, 0-7803-7239-5/02, 2002, pp. 1631-1634.
Hajimiri, Ali, "Distributed Integrated Circuits: An Alternative Approach to High-Frequency Design," *IEEE Communications Magazine*, 0163/6804/02, Feb. 2002, pp. 168-173.
Tsai, King-Chun, et al., "A 1.9-GHz, 1-W CMOS Class-E Power Amplifier for Wireless Communications," *IEEE Journal of Solid-State Circuits*, 0018-9200/99, vol. 34, No. 7, Jul. 1999, pp. 962-970.

* cited by examiner

*Primary Examiner*—Henry Choe
(74) *Attorney, Agent, or Firm*—Law Offices of Terry McHugh

(57) ABSTRACT

A power amplifier utilizes cascode arrangements to achieve target performance levels for a power amplifier, such as the type used in wireless communication devices. A negative resistance circuit is provided for the cascode arrangement such that high gain, or oscillation, is promoted during operation of the power amplifier. In one embodiment, the negative resistance circuit includes cross-coupling transistors. Various features are provided in order to reduce the susceptibility of the power amplifier to voltage breakdown while maintaining good performance.

36 Claims, 12 Drawing Sheets

POWER AMPLIFIER UTILIZING HIGH BREAKDOWN VOLTAGE CIRCUIT TOPOLOGY

TECHNICAL FIELD

The invention relates generally to signal processing and more particularly to providing power amplification to input signals.

BACKGROUND ART

There are a number of concerns which must be addressed in the design and fabrication of circuitry for power amplification, such as the power amplifier of a wireless communication device. For such a device, the concerns include ensuring sufficient gain, providing efficiency with respect to converting direct current (DC) power to radio frequency (RF) output power, establishing breakdown voltage conditions that are sufficiently high to enable long term use of the device, and achieving reliable on-off performance of switching circuitry in switching-class power amplifiers. Currently, there is a desire to use low cost, standard digital complementary metal oxide semi-conductor (CMOS) circuitry for radio functions. This desire magnifies potential problems, because CMOS circuitry typically has very low breakdown voltages.

There are two modes of breakdown voltages which should be considered. The first type of breakdown is junction breakdown. Excess electrons or holes are generated by high electric fields, creating an unwanted flow of current across the device. Eventually, a point is reached where the current actually increases, even as the voltage begins to drop (due to discharge of the anode). This "negative resistance" action allows an increasing current to flow, until excessive heat is generated. Eventually, permanent damage will occur. The second type of breakdown is across an oxide. In MOS processes, the gate of a transistor is insulated by an oxide layer from its drain, source and bulk nodes. Whenever a forward voltage is placed on the gate, there is a potential for breakdown across the oxide, in which the gate can short to the source, drain or bulk regions of the MOSFET. Even if no breakdown occurs across the gate, a long-term threshold voltage shift can occur, which causes the characteristics of the MOSFET to shift, if the gate-source voltage is kept too high for a long period of time.

Power levels commonly used in wireless RF communication devices can result in relatively large voltage swings. For example, at a power level of 4 watts, in order to obtain +36 dBm of transmitted output power on 50 ohm transmission lines, a signal of 40 volts, peak-to-peak may be required. It is likely that conditions are worse for poorly matched loads that are not at the nominal 50 ohm load impedance. The large voltage swings are a problem for modern, high speed semiconductor devices, which typically operate at power supply voltages of only a few volts, with the situation being particularly problematic for sub-micron CMOS integrated circuits which must operate at very low power supply voltages. Part of the problem results from the need to efficiently convert DC power to RF output power. For a single-ended power amplifier circuit running in class A mode, the efficiency may be approximately 50 percent. The class A amplifier is very linear and relatively free of distortion, but is less efficient than a class B amplifier, wherein the efficiency may be 78 percent.

In both the class A and class B modes of operation, transistors of a power amplifier have a linear relation in terms of input-to-output power. This linear operation generally results in a somewhat lower efficiency. If the transmitted signal is constant envelope (or if a modulator is used to take advantage of polar modulation methods), non-linear switching mode amplifiers may be used. One example of such an amplifier is the class E amplifier, which operates as a switching amplifier. That is, the transistors of class E amplifiers operate as switches, turning "on" and "off" during operation. In the case of class E amplifiers, a matching network may be employed to ensure that the switch only operates when the voltage across the transistor is zero, so that there are minimum losses during the switching transitions. This mode of operation can allow efficiencies approaching 100 percent. A class D amplifier is another switching-class power amplifier that works by adjusting its duty cycle in proportion to the input waveform. Unfortunately, while the switching-class power amplifiers are highly efficient, they tend to have lower gain than class A or class B amplifiers. When the gain of the power amplifier is low, it requires more power from the input to turn "on" the output device. This input power reduces the efficiency of the RF system in which the power amplifier is a part. For this reason, the term "power added efficiency" (PAE) has been used as a more accurate reference to the efficiency, since the measurement takes into account input power needed to operate the switches. In general, power amplifiers with higher gain have higher PAE.

Another categorization of power amplifiers is one in which the amplifiers are identified as having either a single-ended configuration or a differential configuration. In the single-ended configuration, a single input signal, generally referenced to ground, is amplified. In comparison, differential amplifiers amplify the voltage difference between two input signals. One deficiency of the single-ended amplifier is the fact that the connection to ground for the source of the input transistor must pass through the inductance of a bond wire and package lead for the integrated circuit that includes the amplifier. On the other hand, in the differential configuration, a virtual ground exists at a common connection to the sources of the two input transistors. As a result, only DC current flows through the grounded bond wire from the sources. In practice, the current in the transistors is not exactly equal and opposite, but most of the beneficial effects are still achieved.

While the above-described configurations of power amplifiers operate well for their intended purposes, further advances are available.

SUMMARY OF THE INVENTION

A power amplifier in accordance with the invention uses cascode arrangements to achieve target performance levels for the power amplifier. A negative resistance circuit is provided for the cascode arrangements such that the gain of the amplifier is substantially increased, up to, and in some cases beyond, the point of oscillation for the amplifier during operation.

In one embodiment, the power amplifier includes first and second amplifier stages, each having an input transistor, a cascode transistor, and a cross-coupling transistor. Within each stage, the input transistor and the cross-coupling transistor are connected in parallel with each other and in series with the cascode transistor. The gate node of each cross-coupling transistor is connected to a source node of the cascode transistor of the other amplifier stage.

It has been determined that in this embodiment, the cascode transistors have a high level of capacitance attached to the bulk nodes of the devices. Additionally, the other two transistors tend to be rather large, so that the drain nodes of the transistors tend to be capacitive. By connecting an inductor between the bulk node of the cascode device and the connections to the input and cross-coupling transistors, the capacitance at the connections of the transistors will resonate out. That is, first and second inductances connected to the bulk nodes are selected to resonate out excess capacitance of connections of the cascode transistors to the other transistors of the same amplifier stage.

In this first embodiment, the power amplifier may have a single-ended configuration, but preferably is a differential power amplifier. The amplifier may include a transformer having a primary connected such that the two amplifier stages cooperate in driving the primary. However, there are advantages to using a balun for providing impedance transformation and balanced-to-unbalanced signal transformation. As a third possibility for providing an "impedance transforming network," a transmission line transformer which relies upon both inductive and capacitive coupling, rather than magnetic flux coupling, may be utilized. Regardless of the selection of the impedance transforming network, the power amplifier may be segmented as a strategy for addressing the limited power-handling ability of the transistors. The parallel amplifier topology of the segmentation enables limiting voltage, current and local power dissipation.

In another embodiment of the invention, the method of providing power amplification includes providing an impedance transforming network defined by at least one segment and providing a differential structure for driving each segment. Each differential structure includes first and second amplifier stages that each have a series connection of transistors with a single cascode device and an input device. The method further includes establishing a negative resistance circuit for the cascode arrangements such that gain is significantly increased to the point where oscillation is promoted by intended operation of the amplifier stages. As a preferred possibility, the negative resistance circuit is the use of the two cross-coupling transistors described above. Thus, in essence, injection-locked oscillators are provided.

Control signals are provided to the gates of the cascode devices independently of current through the series connections of transistors. The step of providing the control signals preferably includes equalizing voltage drops across the cascode and input devices. The breakdown is controlled by ensuring that an AC ground is established from each bulk node of the cascode devices to ground potential and by selecting inductances to resonate out parasitic capacitances in a manner previously described. Voltage breakdown may also be controlled by including monitoring circuitry which actively changes conditions upon detecting the possibility of voltage breakdown.

DETAILED DESCRIPTION

Figure 1:
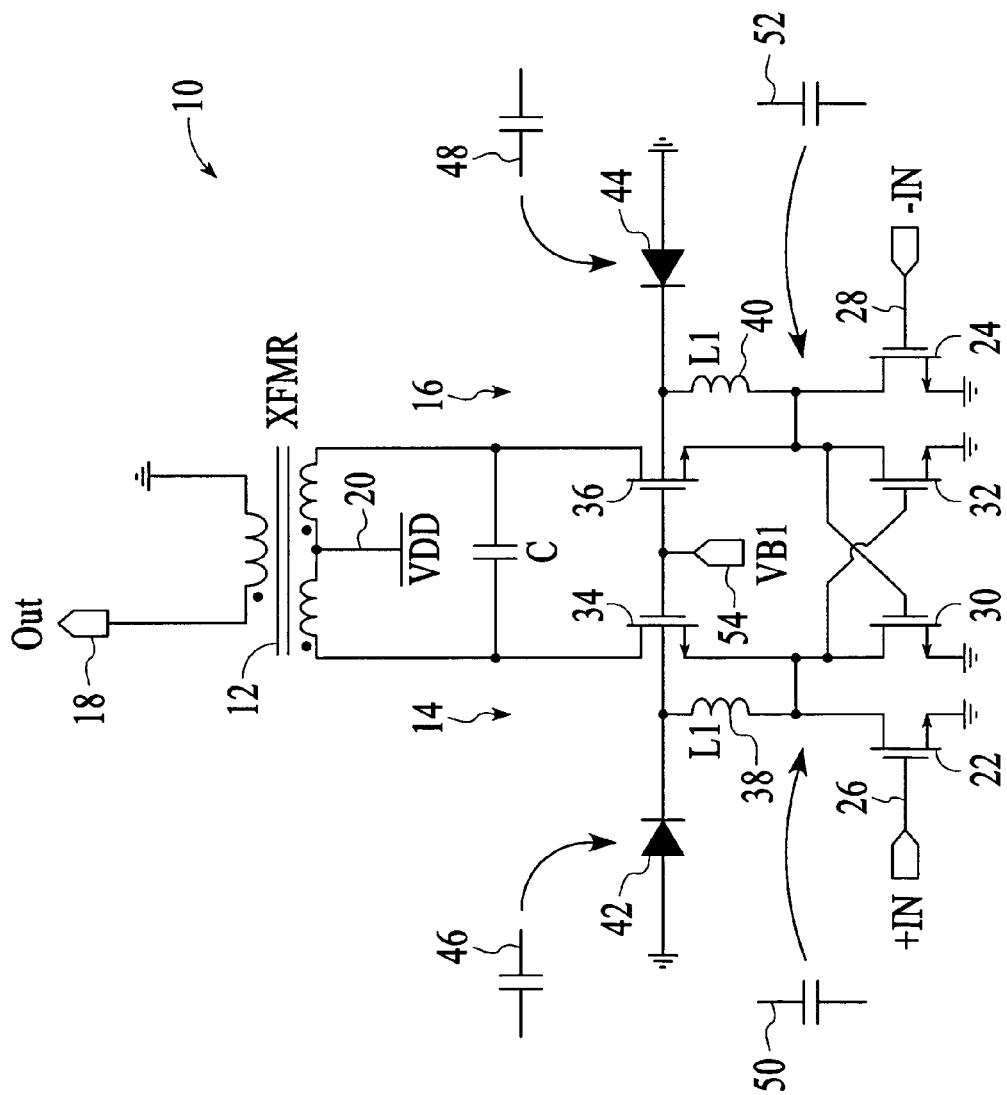
FIG. 1 is an illustration of a power amplifier in accordance with one embodiment of the invention.

In the preferred embodiment of the invention, a cascode topology with deep-NWELL transistors is used to improve the breakdown voltage of a power amplifier 10. The approach allows for much higher signal swings at the power amplifier output, resulting in a higher transmitted power and an increased efficiency. As an additional feature, inductances may be added in order to resonate out excess capacitance at connections of transistors. While FIG. 1 shows one possible embodiment of the invention, modifications may be made without diverging from the invention. For example, the transformer 12 may be replaced with another type of impedance transforming network, such as a balun or a broadband transmission line transformer.

The embodiment of FIG. 1 employs a differential configuration in which a first amplifier stage 14 cooperates with a second amplifier stage 16 to define the RF amplifier output 18 at the secondary of the transformer 12. While not shown in FIG. 1, it is typical to use matching circuits at either or both of the primary and secondary sides of the transformer. A differential configuration of the output inductors and the matching circuits can be achieved by using a center-tapped transformer, as shown. Here, the center tap 20 is connected to VDD, as a convenient means to provide bias voltage to the output transistors.

An advantage of a differential amplifier is that it reduces the voltage swing at individual transistors, since only one half of the total voltage is provided across each transistor drain. Even lower voltage swings are available if different turn ratios are provided in the transformer to provide for a lower impedance at the drains of the output transistors. Basically, the power amplifier 10 swings larger currents at lower voltages in the transformer primary with corresponding large voltage swings and lower current swings at the secondary. Connection of the center tap 20 ensures that the swings are centered at VDD.

As previously described, efficiency is promoted by using switching-class power amplifiers, such as class D or class E amplifiers. Unfortunately, such amplifiers have lower gain than class A or class B amplifiers. When the gain of a power amplifier is low, it requires more power from the input to turn "on" the output devices. This input power reduces the efficiency of the overall power amplifier. However, the power amplifier 10 of FIG. 1 addresses this problem by adding negative resistance across the transistors 22 and 24 connected to receive the inputs 26 and 28. The transistors 22 and 24 will be referred to as the "input" transistors since they receive the input signals for driving the power amplifier.

The negative resistance is provided in the embodiment of FIG. 1 by a pair of cross-coupling transistors 30 and 32. The cross-coupling transistors are in a parallel connection with the input transistors 22 and 24. For each amplifier stage 14 and 16, this parallel connection is in series with a single cascode transistor 34 and 36. By adding sufficient negative resistance, oscillation is promoted. The amount of negative resistance can be adjusted by using different ratios of transistor area in the cross-coupled pair (transistors 30, 32), as compared to the input transistor pair (transistors 22, 24). Despite the fact that the amplifier operates in a very non-linear switching-mode, this mode of operation is tolerable, and actually preferred, in many applications. In the configuration shown in FIG. 1, the circuitry below the cascode devices 34 and 36 may be considered to consist of a cross-coupled pair (negative resistance) with parallel helper transistors. If the negative resistance is high enough, oscillation occurs, resulting, in essence, in an injection-locked oscillator. The lower devices swing between 0V and VDD, limiting the stress on themselves and allowing the cascode devices to operate at a lesser signal swing. The injection-locked oscillator approach uses positive feedback (brought about by the addition of the negative resistance) to achieve increased gain, reducing the drive requirements in the preceding stage. Thus, there is an improved PAE. In general, switching amplifiers, with or without positive feedback, are adjustable in power output by simply varying the VDD voltage. Maximum power is achieved when VDD is at a level that results in signal swings just below breakdown. Minimum power is achieved when VDD is near zero. An advantage of the switching amplifier configuration is that the output match does not have to be re-tuned when VDD changes.

An alternative to the connection shown in FIG. 1 would be to connect the gates of the cross-coupled pair 30 and 32 to the drains of the cascode devices 34 and 36. However, this could potentially create excess voltage across the gates of the cross-coupled pair. A safer approach is the one shown in FIG. 1, wherein the gates of the lower pair are connected to the sources of the cascode devices 34 and 36. This ensures that the gate-source junctions are not overdriven, reducing the issues involving gate-oxide breakdown.

In addition to addressing the issues involving gate-source and drain-source junction breakdowns, breakdowns at the junctions to the bulk nodes are considered. Furthermore, each bulk node of one of the cascode devices is connected to a source of the same transistor for maximum transconductance. Ideally, the bulk node of a cascode transistor is at AC ground and is, at the same time, connected in a DC sense to the source in order to maintain maximum transconductance.

In the power amplifier 10, an inductor 38 and 40 is connected from the bulk node of each cascode device 34 and 36 to the source node of the same device. The low DC impedance of the inductor connects the source and bulk nodes at low frequency. Since the bulk nodes of the cascode devices are very large areas, there is significant capacitance to ground, via the parasitic reverse-biased diodes 42 and 44 formed by the bulk (referred to as RWELL) and the substrate on which the devices are fabricated. The large diodes function as AC decoupling capacitors to ground at the bulk nodes of the cascode devices. In yet other implementations, separate capacitors are added to further ensure the bulk nodes of the cascode devices are truly at AC ground. As shown, there are parasitic capacitances 46, 48, 50 and 52 (associated with the transistors and diodes) which affect the operations of the inductors 30 and 40 and the reverse-biased diodes. In operation, the action of the inductors resonates out excess capacitance at the connections of the sources of the cascode devices 34 and 36 to the transistor pairs below the cascode devices. The end result is a significant improvement with respect to breakdown characteristics, with a significant improvement in high-frequency operation, compared to implementations without said inductors.

The likelihood of breakdown can also be reduced by setting a lower VDD. In the power amplifier 10, VB1 54 also functions as a control signal for voltage breakdown. VB1 is provided to the gates of the cascode devices independently of current through the series connections of the transistors 22, 30 and 34 of the first amplifier stage and independently of current through the transistors 24, 32 and 36 of the second amplifier stage 16. VB1 is set to a level such that both the upper cascode devices (transistors 34, 36) and the lower transistors (22, 30, 32 and 24) are maintained at a voltage below breakdown.

As compared to power amplifiers having more cascode devices, the limitation of a single cascode device 34 and 36 to each amplifier stage 14 and 16 significantly increases the efficiency of the power amplifier 10, by virtue of the fact that a single transistor can have lower resistance when fully switched on.

Figure 2:
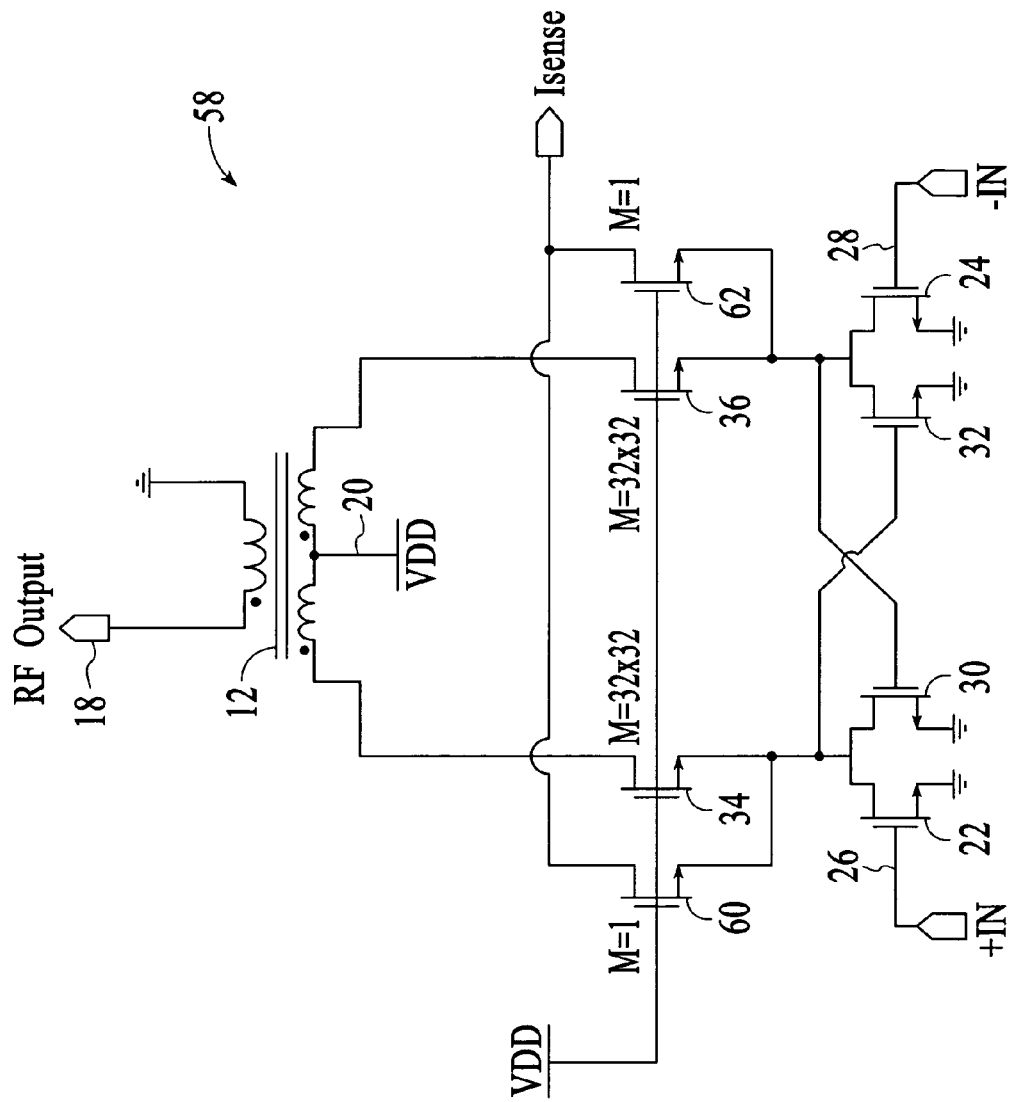
FIG. 2 is an illustration of a power amplifier having current monitoring capability in accordance with the invention.

Thus, the power amplifier 10 includes a number of features which are designed to minimize the likelihood of voltage breakdown at a transistor. Additionally, the circuit shown in FIG. 2 allows the current to be sensed in the output stage. By knowing the current flowing in the output stage along with the knowledge of VDD, the output power can be accurately determined. This is done by connecting small MOSFET devices 60 and 62 in parallel to the cascode devices 34 and 36. For first-order approximation, two MOSFETs having the same gate-source voltages will have the same current flowing in them. This current-mirror action can be used as a means the indirectly sense signal current. Nevertheless, some risk remains, particularly under poorly matched load conditions. Therefore, the power amplifier 58 of FIG. 2 is designed to enable monitoring of the peak voltage at the output drain nodes of the cascode devices 34 and 36. When the peak voltage exceeds a preselected threshold, preventive steps are triggered. For example, VDD can be reduced or the input drive can be reduced. This action will prevent excessive voltage across the output devices. In FIG. 2, the components which are functionally identical to those of FIG. 1 are provided with the same reference numerals. Monitoring is achieved by inclusion of a pair of monitoring transistors 60 and 62 connected to the cascode devices 34 and 36. The gates of these four transistors are connected to VDD. The drains of the monitoring transistors provide the sense signal output 64, which is used to determine when the corrective action is to be triggered. Thus, the current is sensed by the parallel small devices across the relatively large cascode devices. When the signal is combined with information regarding load reflections and the known value of VDD, an accurate transmit power estimate can be established for a wireless communication device. Additionally, since VDD is known, if the output matching elements exhibit tight tolerance, output power can be very accurately determined. Other factors to consider are finite output conductance and any variations in the bias of the gates of the cascode devices. These factors can determine the accuracy of the sense measurements and the efficiency at low VDD levels.

Figure 3:
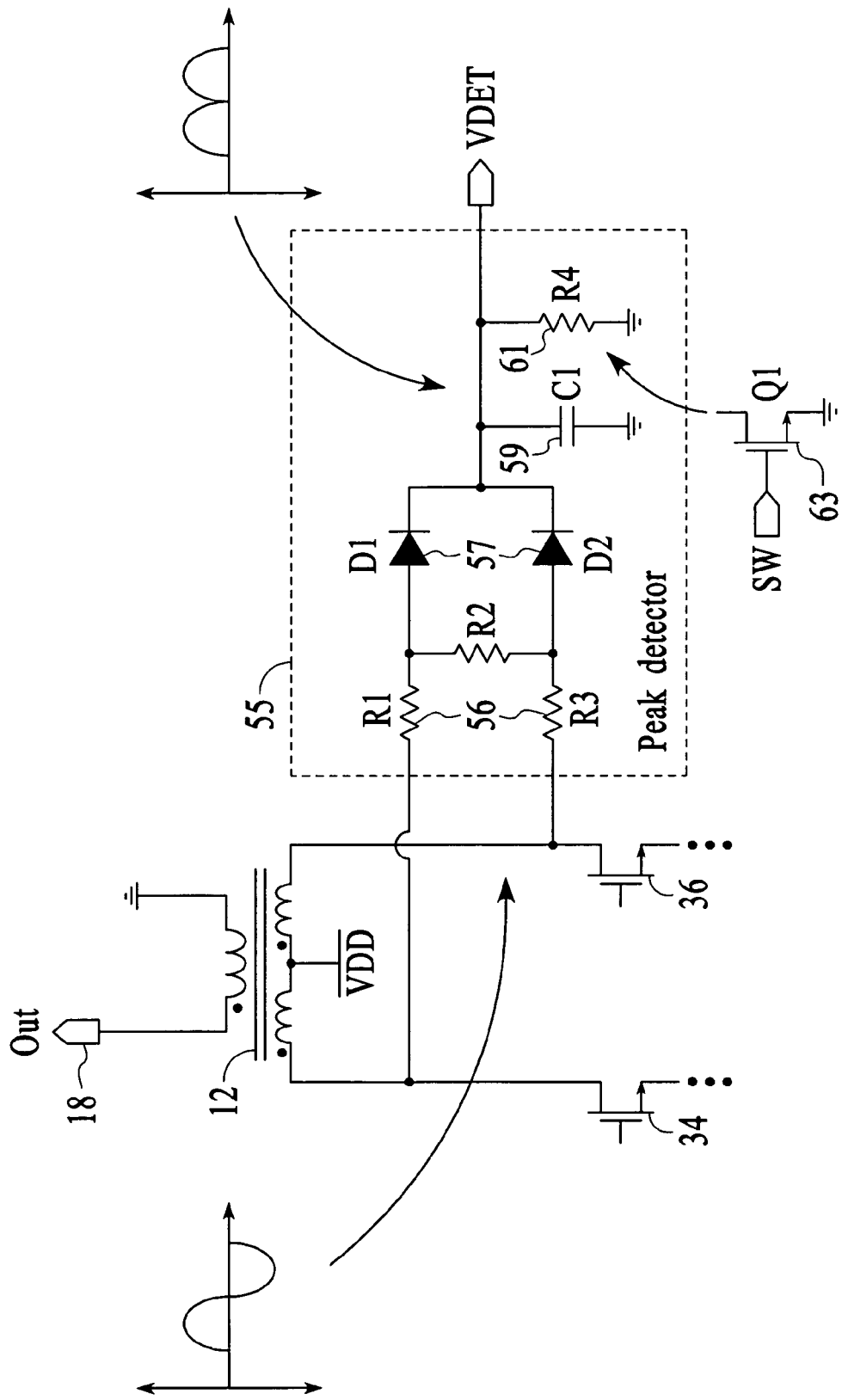
FIG. 3 is one example of a circuit for providing breakdown-related voltage detection.

FIG. 3 is one possible embodiment of a peak voltage detector circuit 55. In this embodiment, a simple diode detector is connected to the drains of the cascode devices 34 and 36. Resistors 56 are used to create larger impedances between the diodes and the output stage to ensure that the output is lightly loaded. The peak voltage on a capacitor 59 may be bled off via a resistor 61, which provides fast attack and slow decay. Alternatively, the peak voltage can be shunted to ground at the end of a packet of data by use of a switching transistor 63, which can be used in place of resistor 61. The use of a transistor to discharge the peak voltage detection capacitor 59 will require additional circuitry, not shown, to coordinate its turn-on and turn-off.

Figure 4:
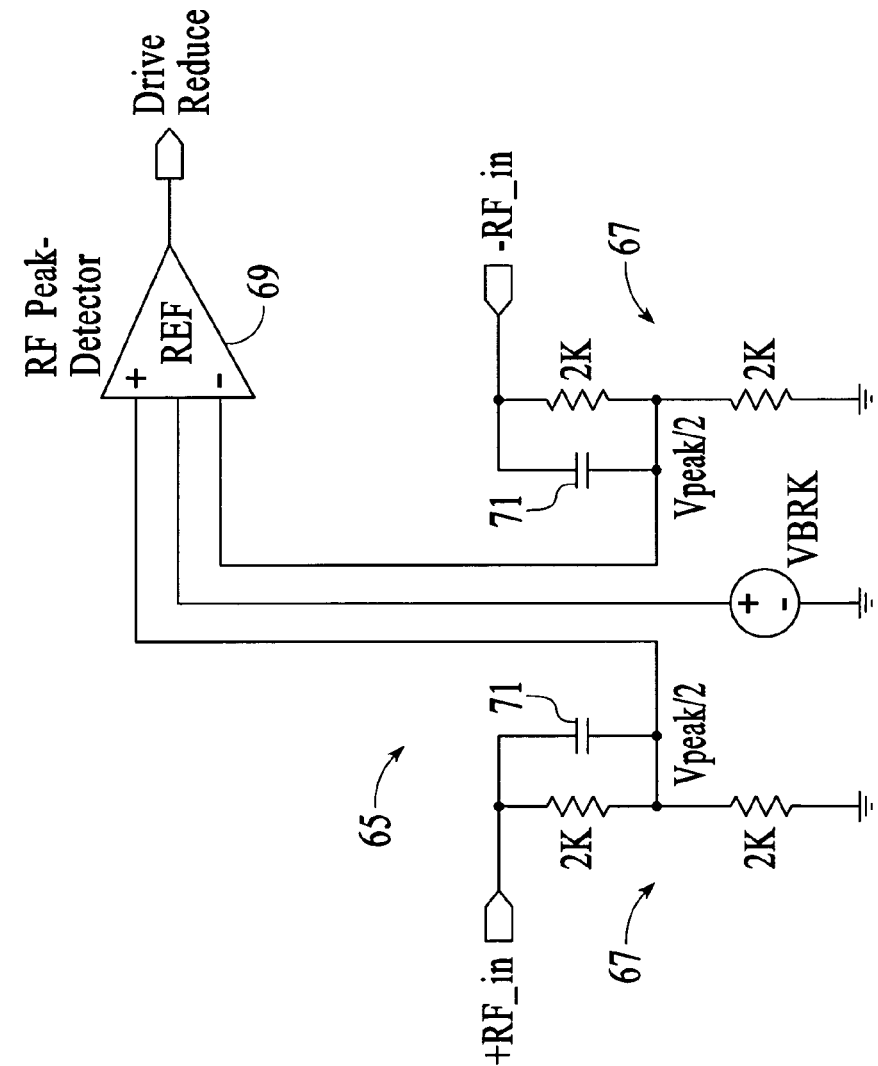
FIG. 4 is one example of circuitry for providing overvoltage protection.

FIG. 4 is an embodiment of an over-voltage protection circuit 65. The circuit can be connected across the drains of the cascode devices 34 and 36 of FIGS. 1 and 2. Resistor dividers 67 accurately reduce the voltage swings to levels acceptable to an RF peak detector 69. When the peak detector determines that the voltage swings are too high, a "drive-reduce signal" can be generated to reduce the levels of the drive signals to the input transistors 22 and 24 of FIGS. 1 and 2 or, alternatively, to reduce the VDD on the power amplifier. Small "speed-up" caps 71 may be required to maintain sufficient bandwidth. An important aspect of the circuit is that it should be a very light load on the power amplifier output, so that high efficiency is maintained.

Figure 5:
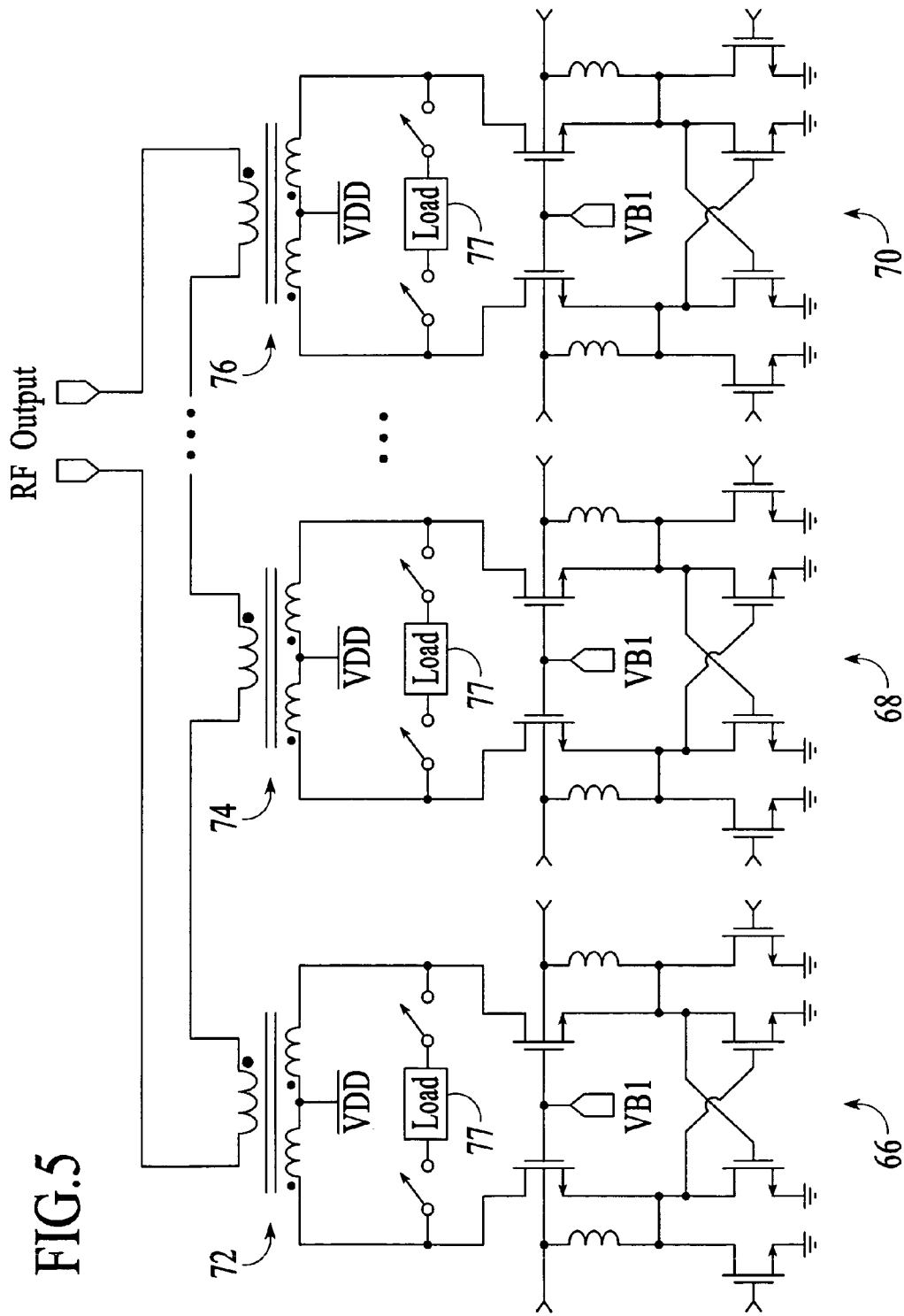
FIG. 5 is an illustration of a segmented power amplifier in which each segment has an alternative load capability.

A strategy for addressing the limited power-handling capability of CMOS devices is shown in FIG. 5. Here, simplified schematics of parallel amplifiers 66, 68 and 70 that are consistent with the power amplifier of FIG. 1 are shown as providing a parallel amplifier topology that limits voltage, current and local power dissipation. Any number of parallel amplifiers can be used to achieve the desired power reduction per amplifier stage, although constraints due to the routing of RF lines on-chip and the need for coordinated control of the stages generally result in the number of stages ranging between four and eight, in practice. The benefits of a 1:N step-up in the transformer can be achieved by connecting the secondary windings of multiple 1:1 transformers in series, although said transformers could use other impedance ratios, in practice. The individual parallel differential stages 66, 68 and 70 provide the desired 1:N step-up, with N being the number of stages. A concern with the use of flux-coupled transformers is that such transformers may suffer from poor magnetic coupling between the primary and secondary of each transformer 72, 74 and 76, thereby limiting bandwidth, adding insertion loss, and providing an imbalance induced by the grounded node on the secondary of the last stage. All of these unwanted effects reduce power and efficiency. Another concern with this approach is that it requires a large die area for fabrication and is somewhat difficult in the connections to VDD, unless a center-tap configuration is used. Another advantage of using multiple parallel amplifiers is that any one section of the amplifier can be powered on or off, individually. This allows the output power to be set in discrete steps, thus providing for better efficiency at lower power settings. For example, maximum power is achieved when all sections are turned on and minimum power is achieved when only one section is turned on. In general, it is desirable to ensure that the load being presented to each input of the balun remains the same whether the stage is turned on or off. This can be accomplished by using a switch-able load circuit 77, shown in FIG. 5. Note that power level adjustments between discrete power settings, as determined by the number of stages turned on at a given time, are effected by varying the VDD voltage, as described earlier.

Figure 6:
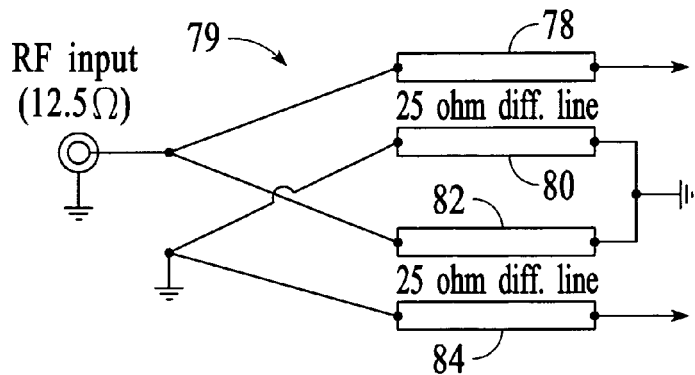
FIG. 6 is an illustration of the use of a balun as an impedance matching network.
Figure 7:
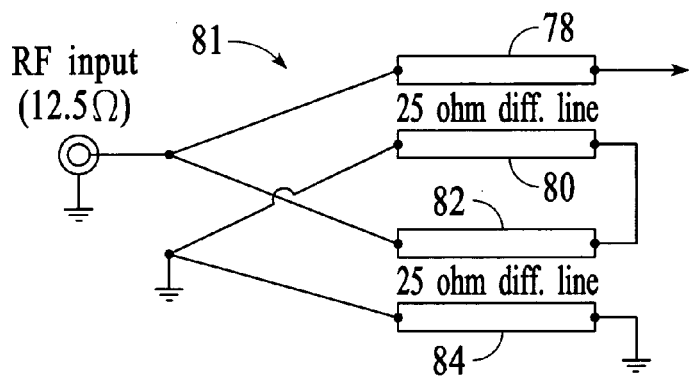
FIG. 7 is an illustration similar to FIG. 6, but with a single-ended output.
Figure 8:
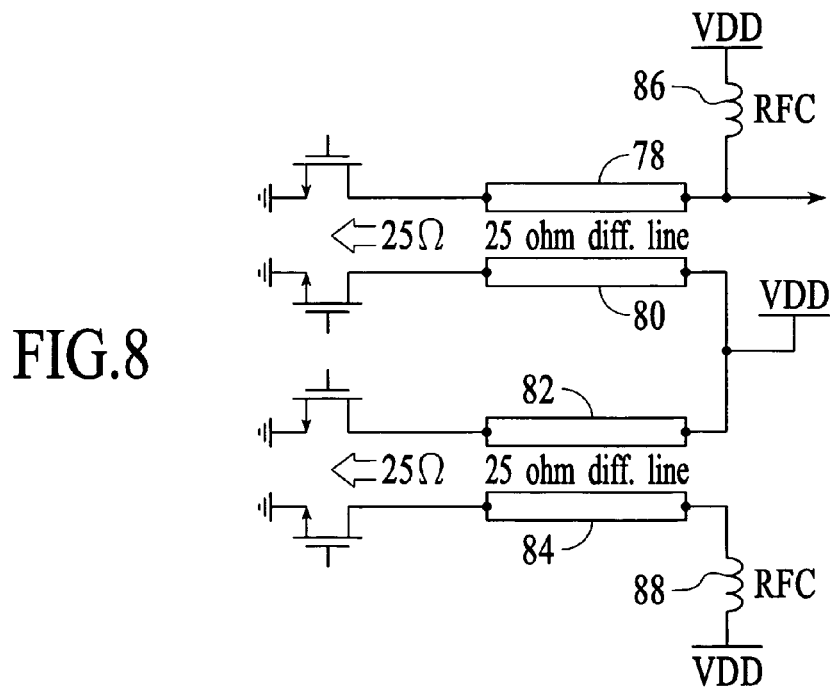
FIG. 8 illustrates an alternative to FIG. 6.

One approach to alleviating the unwanted effects resulting from reliance on magnetic coupling in the transformers is to replace the "flux coupled" transformers with transmission line transformers. This is shown in FIGS. 6, 7 and 8. In FIG. 6, by using two pairs of coupled lines 78, 80, 82 and 84, low loss, broadband transmission line transformers can be fabricated. The transmission line transformers rely on both inductive and capacitive coupling. Bandwidths can exceed three decades in practice, with losses approaching 0.1 dB. The coupled lines can consist of edge-to-edge coupled lines, as shown in FIG. 6, or can consist of over-under coupled lines. Different configurations of transmission-line transformers can be designed, depending on the impedance transformation desired and the need for balanced-to-unbalanced operation.

The particular transformer shown in FIGS. 6, 7 and 8 is referred to as the Guanella balun. The action of this circuit both transforms impedance and does the balanced-to-unbalanced transformation of the signal.

The action of the Guanella balun 79 of FIG. 6 steps up the input voltage by a factor of two and steps up the impedance by a factor of four. Thus, with the input impedance of 12.5 ohms in FIG. 6, the stepped up output impedance is 50 ohms. Other impedances can be used with such baluns, but the 1:4 action remains the same. For example, an input impedance of 6.25 ohms can be obtained with a 25 ohm output impedance. Note that FIG. 6 shows the output of the balun being taken differentially, which can be a benefit in some applications. FIG. 7 shows a more typical use of the Guanella balun 81, wherein the ground connection is removed from between nodes 82 and 80 and placed on node 84. This allows for a balanced (differential) input to the balun and an unbalanced (or single-ended) output from the balun. The importance of this issue will be discussed more in reference to FIGS. 8 and 9.

Figure 9:
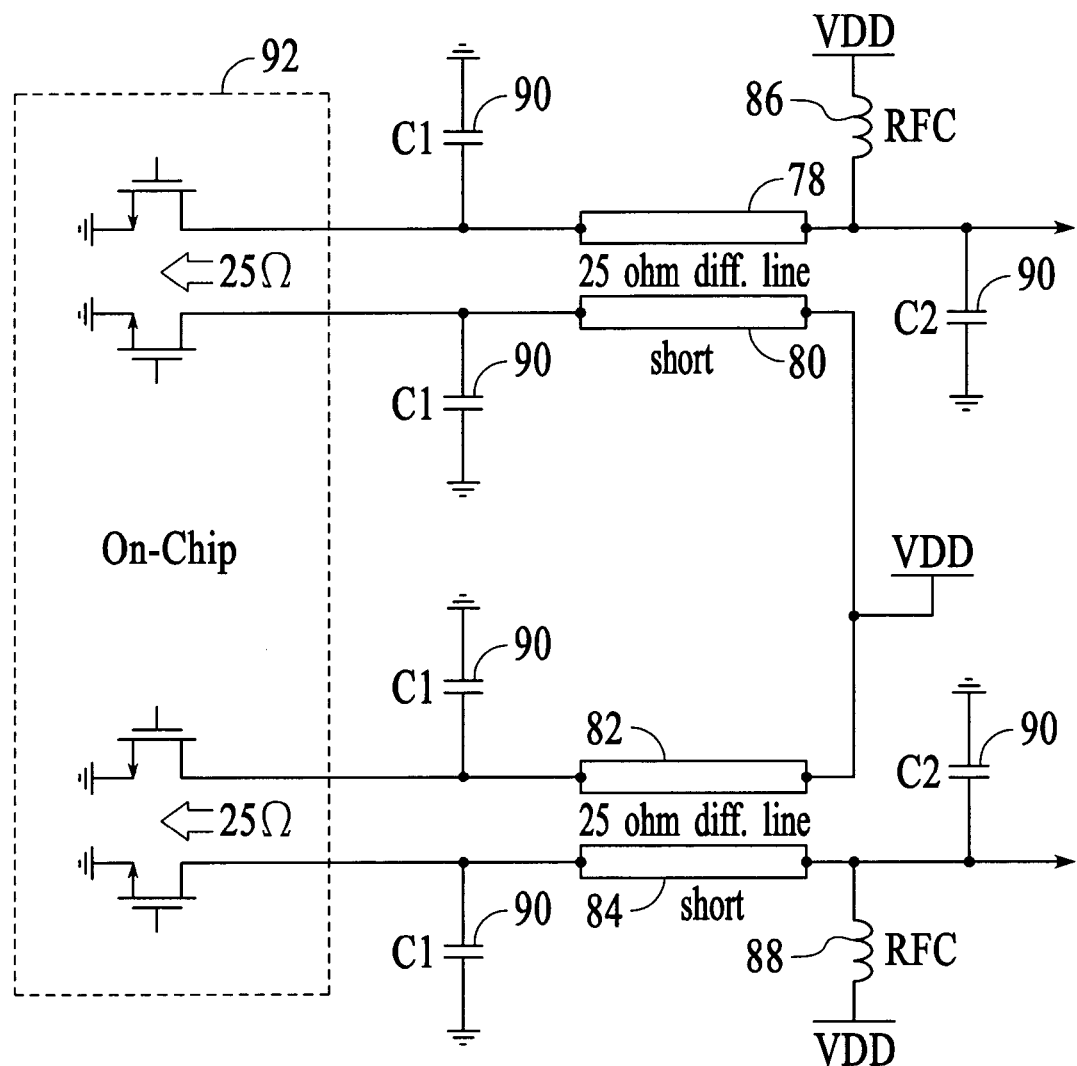
FIG. 9 illustrates how the balun can be made physically small with capacitive loading.

One challenge with the Guanella balun involves connecting VDD. This can be accomplished in a variety of ways, including using RF chokes 86 and 88, as shown in FIG. 8. Alternatively, the connections for VDD may be brought from the circuitry that follows the balun. It has been found that it is important to maintain nearly perfect balance at the final power amplifier stage outputs for optimum efficiency and acquiring the highest power output. The action of the Guanella balun meets these requirements more readily than the transformer-coupled circuitry described above. In general, this means that the final power combiner (not shown) which takes outputs from the baluns (as shown in FIG. 8) needs to do a final balanced-to-unbalanced transformation. FIG. 9 is a modification of the circuitry of FIG. 8. While distributed elements tend to have low loss and wide bandwidth, they also tend to be physically large. The physical size of such elements can be greatly reduced by using surface-mounted components to "capacitively load" the transmission lines 78, 80, 82 and 84. The capacitive loading is represented by six capacitors 90 in FIG. 9. Note that the VDD node is assumed to be an AC short, thus not requiring additional capacitors to ground. The capacitive loading generally reduces bandwidth. However, for applications which can afford to sacrifice some bandwidth, the transmission lines can be made physically shorter by capacitively loading the ends of the lines with lumped capacitors 90. The shorter transmission lines are far more attractive for integrated assemblies, such as those which are used in cellular telephones and other wireless communication devices. Only the transistors need to be on-chip, where the integrated circuit chip is represented by box 92.

In a fashion similar to the one described with reference to FIG. 3, outputs of baluns can be combined to sum the output power from a collection of parallel amplifier stages. Thus, using a number of parallel stages allows each stage to operate at a lower individual power level, and therefore at lower voltage swings. For example, four parallel amplifier stages may be combined to be a quadrature balun. As will be explained more fully below, the combination may be with zero degree or ninety degree inputs. The combination could be in-phase or push-pull, or other power combining techniques may be used. The amplifier stages can be turned off in a one-by-one manner to lower the total output power with no efficiency loss. This feature maintains a high efficiency over a large range of output power levels and is often vital to obtaining the most "talk time" from a battery within a cellular telephone.

As another possibility, two or more Guanella baluns may be connected to a final power combiner. Each Guanella balun is coupled to cooperative amplifier stages as described above. In this embodiment, the inputs to the final power combiner (e.g., a final balun) may be either differential or single-ended.

Figure 10:
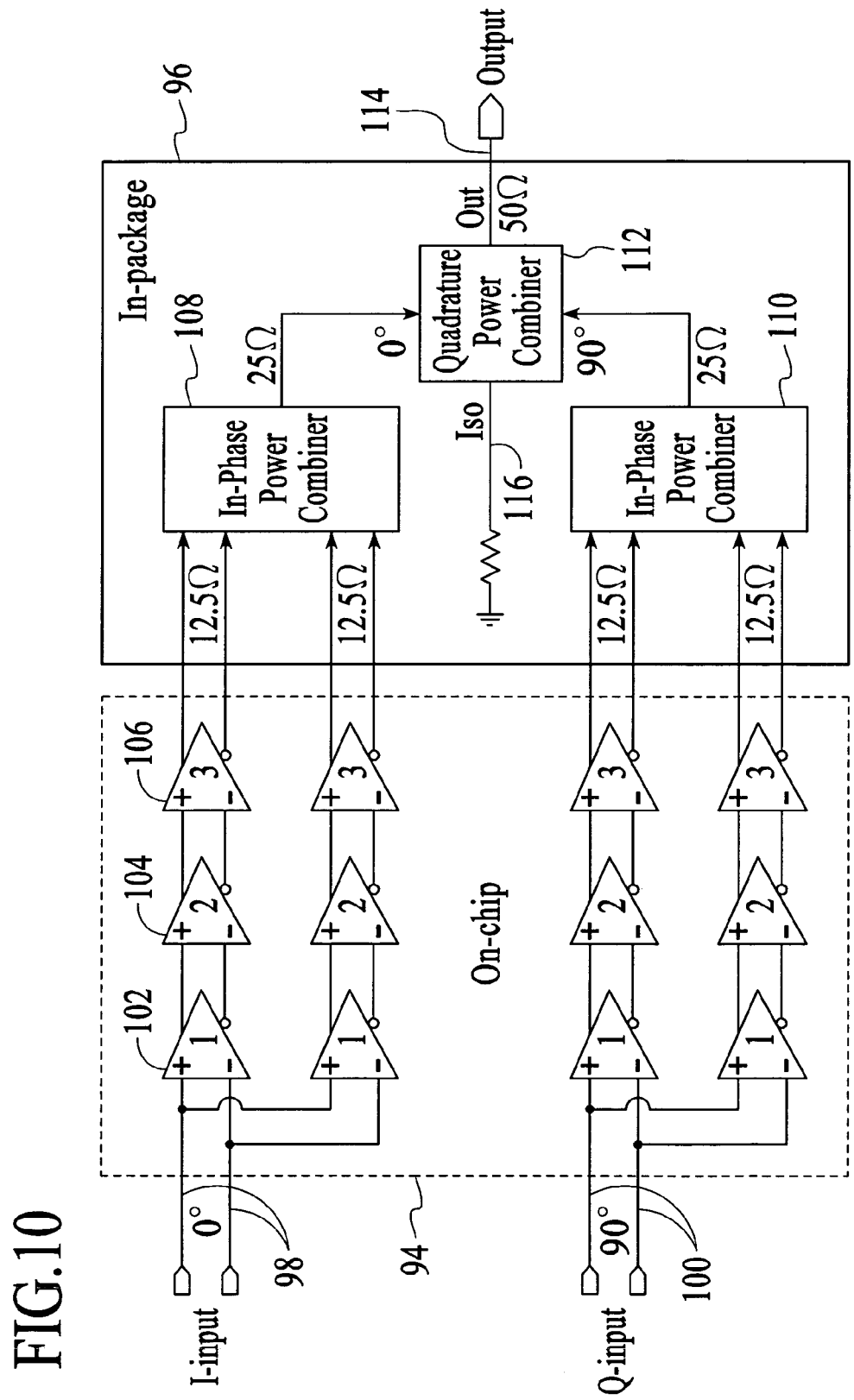
FIGS. 10, 11 and 12 illustrate alternative approaches to providing amplification and signal combination.
Figure 11:
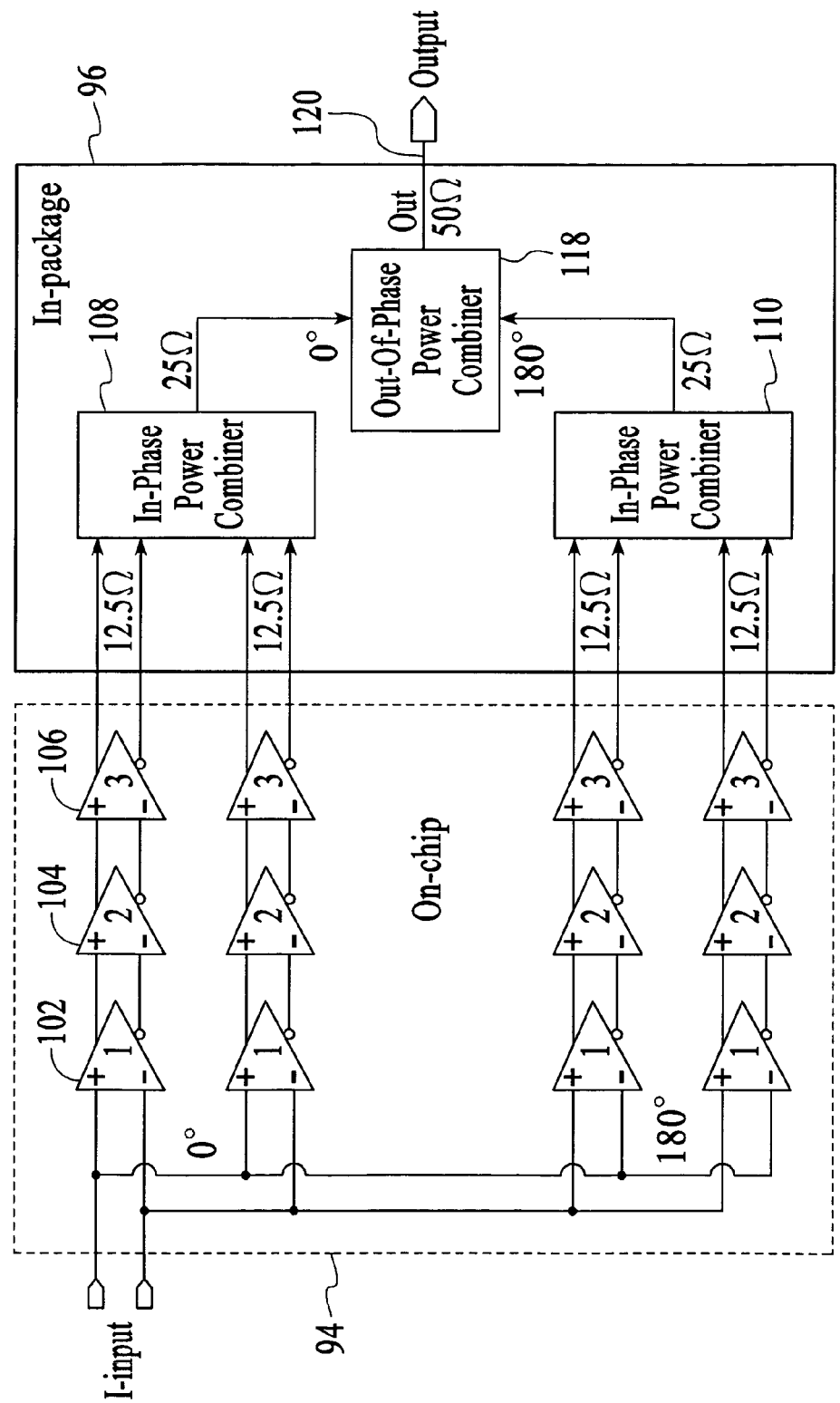
Figure 12:
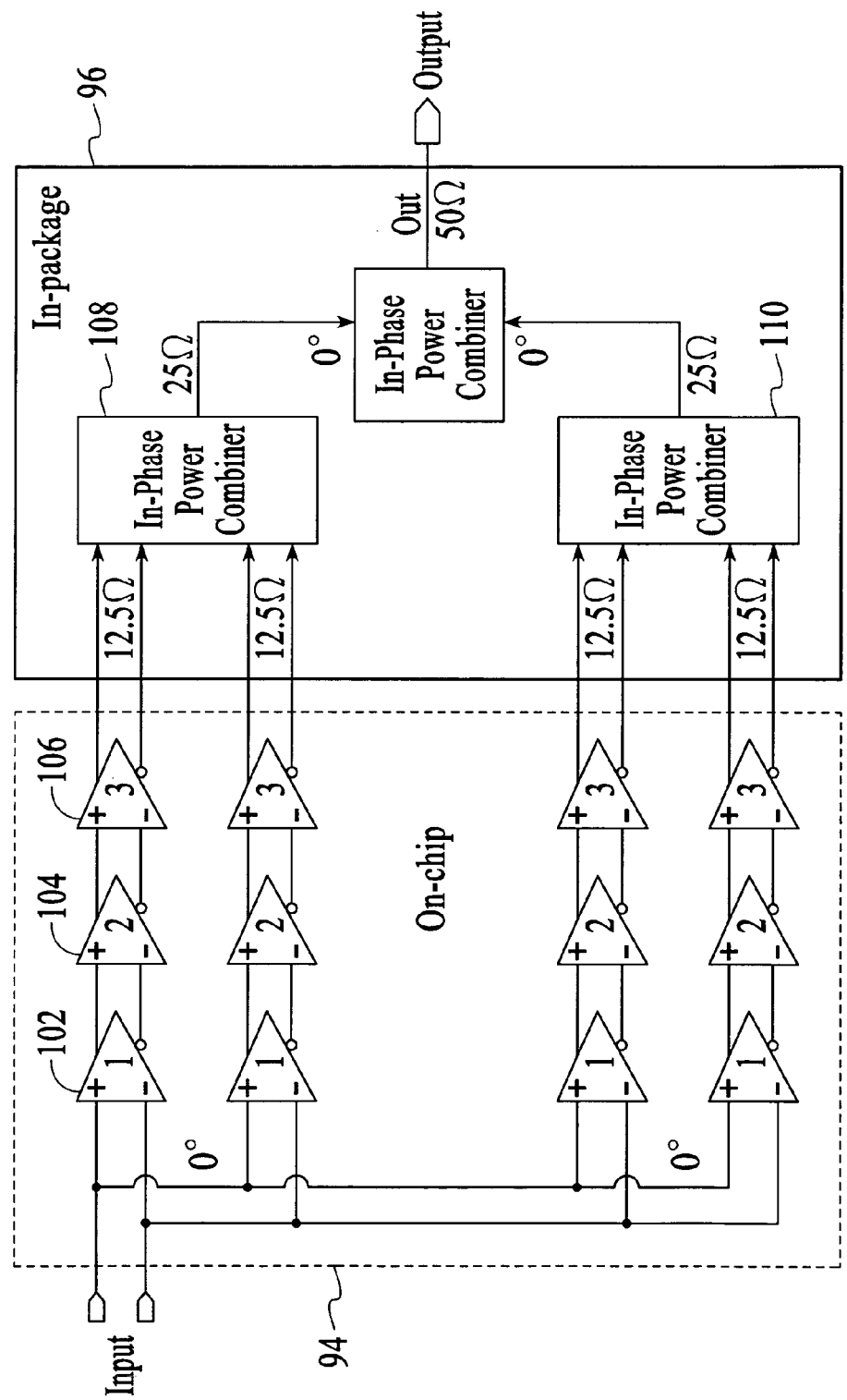

As previously noted, the voltage across a 50 ohm load, with four watts of power, can reach 40 volts, peak-to-peak. Also noted was the fact that parallel amplifier configurations may be used to alleviate the concerns. FIGS. 10, 11 and 12 show different baseline parallel amplifier configurations. In each embodiment, a first box 94 encloses components which are contained on a single integrated circuit chip, while a second box 96 encloses components that are off-chip but which can be within the same integrated circuit package as the components of box 94. However other arrangements are contemplated. In the embodiment of FIG. 10, the inputs 98 and 100 are 90 degrees out-of-phase, which eventually requires a 90 degree phase shift in the power combining components at the output of the power amplifiers. Each of four parallel amplifier strings comprises three amplifiers 102, 104 and 106. Optionally, a different number of amplifiers may be employed in each string. The on-chip components provide four 12.5 ohm inputs for a pair of in-phase power combiners 108 and 110. The outputs of the in-phase power combiners define 25 ohm inputs to a quadrature power combiner 112. Thus, the in-phase power combiners both transform impedances and convert differential inputs from the differential amplifiers 106 to establish single-ended outputs. The two single-ended outputs from the in-phase power combiner are used to define the 50 ohm output 114. The quadrature power combining approach has the advantage that load reflections can be terminated at an isolated ("Iso") port 116.

In the approach of FIG. 11, out-of-phase power combining is used. This approach is sometimes referred to as the "push-pull approach." As in FIG. 10, the outputs of two upper power amplifier stages are combined using the in-phase power combiner 108, while the signals from the two lower amplifier stages are combined by the in-phase power combiner 110. However, in this approach, the signals from the upper amplifier stages are connected in-phase (0 degrees), while the signals from the two lower amplifier stages are connected out-of-phase (180 degrees). An out-of-phase power combiner 118 defines the 50 ohm output 120. This approach avoids the need of quadrature inputs, but does not have the advantages of the isolated port to eliminate load reflections.

The approach of FIG. 12 is similar to the configuration of FIG. 11, but the final power combiner 122 is an in-phase component, since the preliminary power combiners 108 and 110 provide a pair of in-phase (0 degrees) signals. Thus, both the inputs and outputs of the stages of power amplifiers 102,104 and 106 are connected (and combined) in-phase. Similar to the approach of FIG. 11, the in-phase approach of FIG. 12 does not have the advantage of the isolated port.

For configurations such as that of FIG. 10 in which quadrature inputs are used, the inputs may be obtained from a 0°/90° power splitter or may be obtained from in-phase and quadrature signals that are available from other components of the integrated circuit chip. However, the advantage of acquiring the in-phase and quadrature components directly from the chip is that it eliminates the need of an input 0°/90° power splitter.

Figure 13:
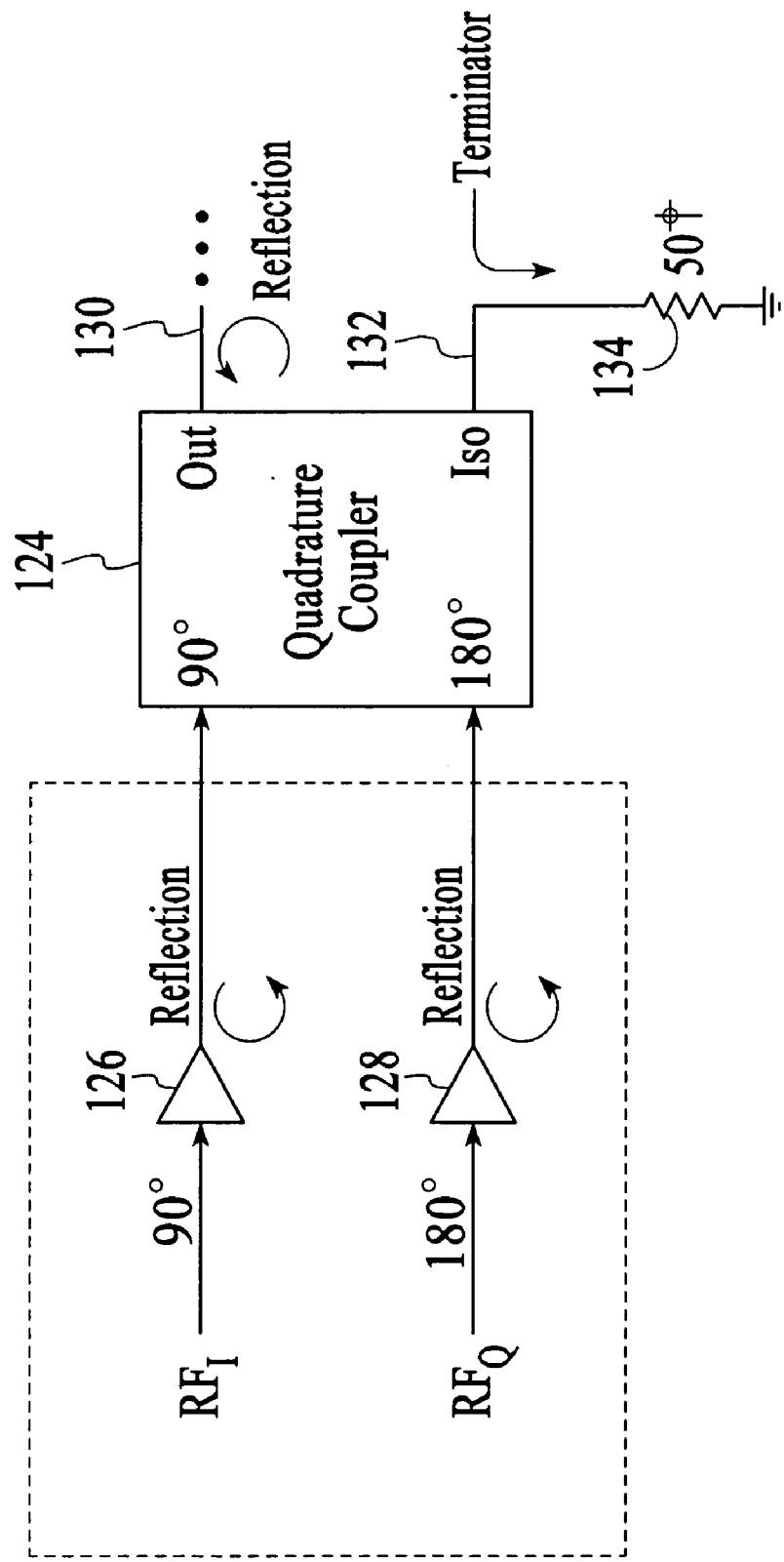
FIG. 13 illustrates the use of a quadrature hybrid balun for terminating reflections from the load.

For approaches in which the isolation port is available, reflections can be terminated in the manner shown in FIG. 13. A quadrature coupler (sometimes referred to as a "hybrid coupler") 124 is connected to receive the in-phase signal component ($RF_I$) and the amplified quadrature signal component ($RF_Q$) from amplifiers 126 and 128. The quadrature couple includes its output port 130 and its isolation port 132. If the circuitry is part of a transceiver that is operated near a structure which reflects the output frequency, the reflections will be redirected to the isolation port and terminated using a 50 ohm termination resistor 134.

Figure 14:
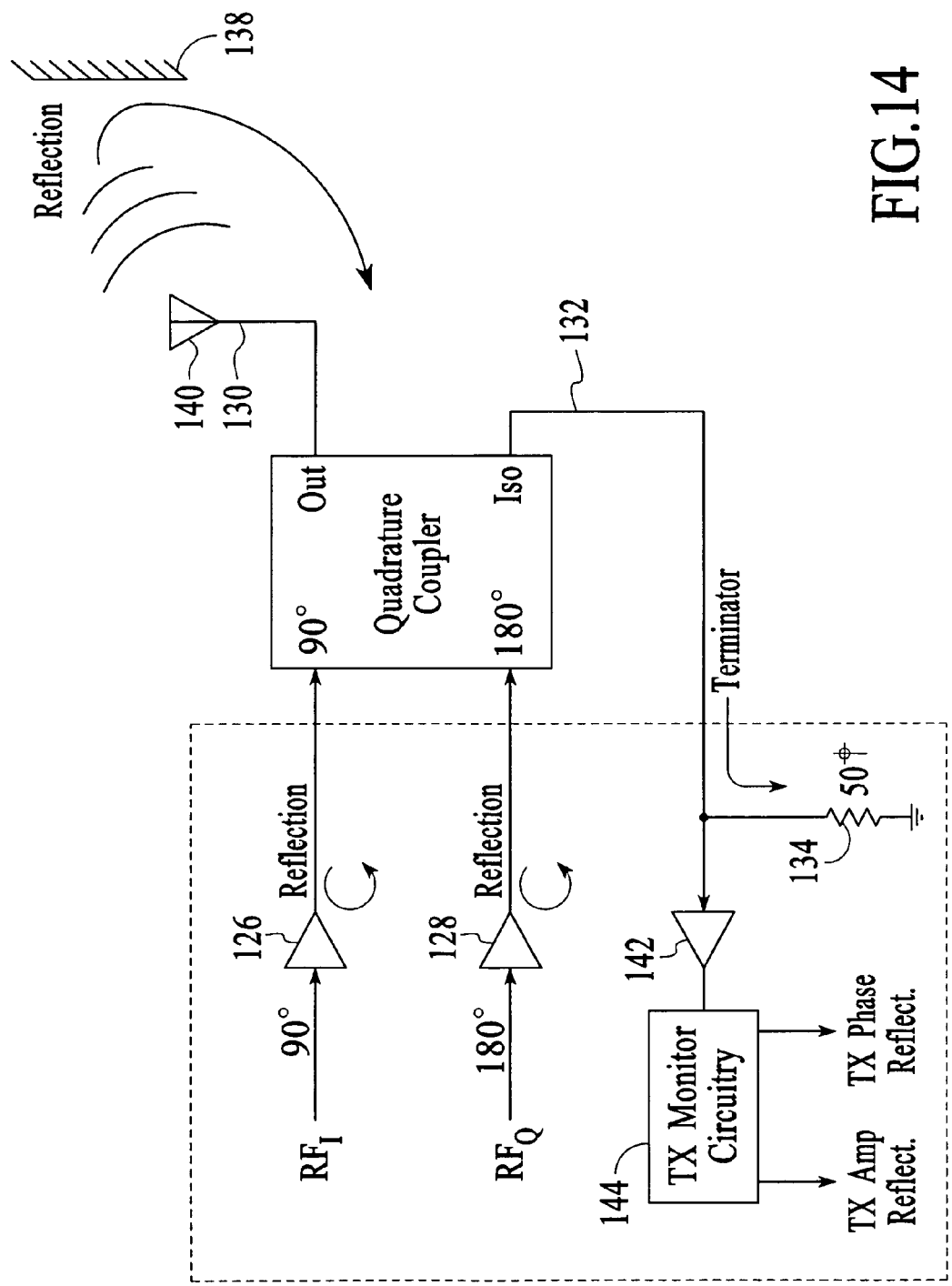
FIG. 14 illustrates an arrangement for monitoring reflections of signals transmitted via a power amplifier.

Alternatively, the "information" at the isolation port 132 may be used as the basis to monitor the reflected energy at the output port 130. This is represented in FIG. 14. Reflections from a structure 138 return an antenna 140 connected to the output port 130. The isolation port is connected to the termination resistor 134 and to a reflection amplifier 142. The amplified reflection signal is directed to monitoring circuitry 144 which generates data indicative of both the amplifier reflection and the phase reflection. It is then possible to provide a better idea of the true transmitted output power, as well as a means to enhance the transmission signal back to a receiver at the other end of the link.

What is claimed is:

1. A power amplifier comprising:
    a first amplifier stage having a first cascode transistor in series with a parallel connection of a first input transistor and a first cross-coupling transistor; and
    a second amplifier stage having a second cascode transistor in series with a parallel connection of a second input transistor and a second cross-coupling transistor, said first and second cascode transistors having drain nodes which are cooperatively coupled such that said first and second amplifier stages combine to define a power-combined output;
    wherein a gate node of said first cross-coupling transistor is connected to a source node of said second cascode transistor and wherein a gate node of said second cross-coupling transistor is connected to a source node of said first cascode transistor.

2. The power amplifier of claim 1 further comprising a first inductance and a second inductance, said first inductance connecting a pair of nodes of said first cascode transistor, said second inductance connecting a pair of nodes of said second cascode transistor, wherein each of said pair of nodes includes a bulk node.

3. The power amplifier of claim 2 wherein each of said pair of nodes further includes the respective said source node of said first and second cascode transistor.

4. The power amplifier of claim 2 wherein said first and second cascode transistors are transistors for which said bulk nodes are coupled to ground by parasitic reverse-biased diodes from said bulk nodes to a substrate on which said first and second amplifier stages are formed, said parasitic reverse-biased diodes being a consequence of fabrication of said transistors.

5. The power amplifier of claim 4 further comprising decoupling capacitors connecting said bulk nodes to ground, thereby ensuring that said bulk nodes are at AC ground.

6. The power amplifier of claim 2 wherein said first and second inductances are selected to resonate out excess capacitance of connections at said first and second cascode transistors to respective said parallel connections of said input transistors to said cross-coupling transistors.

7. The power amplifier of claim 1 further comprising a primary of a transformer, said primary being connected between said drain nodes of said first and second cascode transistors, such that said first and second amplifier stages cooperate in driving said primary.

8. The power amplifier of claim 7 wherein said transformer is a transmission line transformer and said primary is one of a plurality of said primaries, wherein each said primary is coupled between first and second amplifier stages, thereby defining a parallel amplifier configuration.

9. The power amplifier of claim 7 wherein said transformer is a transmission line transformer in which at least one transmission line is capacitively loaded to enable reduction in a length of said transmission line.

10. The power amplifier of claim 1 wherein said first and second power amplifier stages define a first segment in a multi-segment parallel amplifier configuration, each said segment in said configuration being individually controllable with respect to activating and deactivating said segment, thereby enabling output power of said power amplifier to be controlled.

11. The power amplifier of claim 10 wherein each said segment includes a switch-able load that is coupled and decoupled in response to deactivating and activating said segment.

12. The power amplifier of claim 10 wherein at least a last segment of said configuration is manipulable with respect to connection to VDD, thereby enabling further control of said output power of said power amplifier.

13. The power amplifier of claim 1 further comprising a balun for providing impedance transformation and balanced-to-unbalanced signal transformation, said first and second amplifier stages being connected to said balun such that said power-combined output is achieved.

14. The power amplifier of claim 13 wherein said first and second amplifier stages are connected to said balun to provide differential amplification.

15. The power amplifier of claim 1 wherein each of said first and second amplifier stages is limited to a single said cascode transistor.

16. The power amplifier of claim 1 wherein said first and second cascode transistors are connected to a voltage source that is controlled to provide a generally equal voltage drop across each of said first and second cascode transistors and said parallel connections.

17. The power amplifier of claim 1 further comprising means for varying application of VDD in response to detection of a condition in which power control is to be implemented.

18. The power amplifier of claim 17 wherein said means for varying enables adjustments of VDD within a range from slightly greater than 0V to a voltage selected to prevent voltage swings that would induce voltage breakdown within said first and second amplifier stages.

19. A method of providing power amplification comprising:
providing an impedance transforming network defined by at least one segment;
providing a differential structure in driving said segment such that there are at least two amplifier stages;
providing a cascode arrangement for each said amplifier stage, including limiting each said cascode arrangement to a series connection of transistors having a single cascode device and an input device;
establishing a negative resistance circuit for said cascode arrangements such that higher gain or oscillation is promoted by positive feedback during intended operation of said amplifier stages; and
providing control signals to gate nodes of said cascode devices independently of current through said series connections.

20. The method of claim 19 wherein providing said control signals includes equalizing voltage drops at opposite sides of said series connections.

21. The method of claim 19 wherein providing said cascode arrangement and establishing said negative resistance circuit limits each said amplifier stage to three transistors.

22. The method of claim 19 wherein establishing said negative resistance circuit includes cross coupling said cascode arrangements by connecting a cross-coupling transistor within each said amplifier stage such that said cross-coupling transistor is in series with said single cascode device and in parallel with said input device, said cross-coupling transistor of a first amplifier stage having a gate node linked to said series connection of a second amplifier stage, said cross-coupling transistor of said second amplifier stage having a gate node linked to said series connection of said first amplifier stage.

23. The method of claim 19 further comprising controlling voltage breakdown to a bulk node of each said cascode device by introducing an inductance from said bulk node to a respective said input device in the same said series connection.

24. The method of claim 23 wherein said controlling voltage breakdown further includes ensuring an AC ground from each said bulk node to ground potential and includes selecting said inductances to resonate out parasitic capacitances at said series connections of said cascode devices to said input devices.

25. The method of claim 19 wherein providing said impedance transforming network includes forming a multi-segment circuit that includes one of a balun and a transformer connected to a plurality of said first and second amplifier stages, wherein output power is determined by cooperative operation of said multi-segment circuit.

26. The method of claim 25 further comprising controlling levels of VDD to at least one of said first and second amplifier stages of said multi-segment circuit, thereby adjusting said output power.

27. The method of claim 25 further comprising varying said output power by individually activating and deactivating segments in said multi-segment circuit.

28. The method of claim 27 further comprising coupling and decoupling an alternative load for a specific said segment each time that said specific segment is deactivated and activated, respectively, wherein said coupling and decoupling is available for each segment in order to stabilize load conditions for different combinations of segment deactivations and activations.

29. A power amplifier comprising:
an impedance transforming network;
first and second amplifier stages connected to drive said impedance transforming network, each said amplifier stage having a cascode arrangement of a single cascode device and an input device connected in series;
a negative resistance circuit interconnecting said first and second amplifier stages to induce oscillation;

drive signal inputs connected to said input devices; and
control signal inputs connected to said single cascode device of said first amplifier stage and said single cascode device of said second amplifier stage.

30. The power amplifier of claim 29 wherein said impedance transforming network includes a Guanella balun.

31. The power amplifier of claim 29 further comprising a plurality of said impedance matching networks cooperatively coupled to define an amplifier output, said impedance matching networks being baluns that include a final balun having inputs from the other said baluns, said inputs being either differential or single-ended.

32. The power amplifier of claim 29 wherein said impedance transforming network includes a multi-segment transformer in which each segment is driven by first and second amplifier stages, thereby providing a power combining network.

33. The power amplifier of claim 29 wherein said impedance transforming network includes broadband transmission line transformers.

34. The power amplifier of claim 29 wherein said negative resistance circuit includes a cross-coupling transistor for each of said first and second amplifier stages, wherein a first said cross-coupling transistor of said first amplifier stage has a gate node connected to said cascode arrangement of said second amplifier stage and wherein a second cross-coupling transistor of said second amplifier stage has a gate node connected to said cascode arrangement of said first amplifier stage.

35. The power amplifier of claim 29 wherein each said first and second amplifier stages includes an inductance connecting a pair of nodes of the respective said single cascode device, wherein one of said nodes is a bulk node coupled to ground by a parasitic reverse-biased diode.

36. The power amplifier of claim 29 wherein said inductance of each of said first and second amplifier stages is selected to resonate out excess capacitance at connections of said single cascode devices to said input devices.

* * * * *